United States Patent [19]

Woditsch et al.

[11] Patent Number: 4,755,220

[45] Date of Patent: Jul. 5, 1988

[54] MATERIALS RESISTANT TO METAL AND SALT MELTS, THEIR PRODUCTION AND THEIR USE

[75] Inventors: Peter Woditsch, Krefeld; Werner Kannchen, Duisburg; Horst Lange; Ingo Schwirtlich, both of Krefeld, all of Fed. Rep. of Germany

[73] Assignee: Bayer Aktiengesellschaft, Leverkusen, Fed. Rep. of Germany

[21] Appl. No.: 117,329

[22] Filed: Nov. 6, 1987

[30] Foreign Application Priority Data

Nov. 18, 1986 [DE] Fed. Rep. of Germany ....... 3639335

[51] Int. Cl.$^4$ .............................................. C22C 29/12
[52] U.S. Cl. .................................... 75/233; 75/234; 75/235; 75/244; 106/287.34; 156/DIG. 83; 249/134; 249/135; 266/275; 501/97; 264/122
[58] Field of Search ................ 75/233, 234, 235, 244; 264/122; 249/134, 135; 156/DIG. 83; 266/275; 501/97; 106/287.34

[56] References Cited

U.S. PATENT DOCUMENTS

| | | | |
|---|---|---|---|
| 4,463,935 | 8/1984 | Yonekawa | 75/49 |
| 4,482,388 | 11/1984 | Crosbie | 419/2 |
| 4,576,872 | 3/1986 | Ward | 419/2 |
| 4,585,618 | 4/1986 | Fresnel et al. | 419/19 |

*Primary Examiner*—Stephen J. Lechert, Jr.
*Attorney, Agent, or Firm*—Connolly and Hutz

[57] ABSTRACT

A material resistant to high temperature melts of metal and salt which comprises a composite material containing silicon nitride, silicon oxynitride, silicon dioxide and silicon prepared by (a) suspending silicon powder in SiO$_2$ sol to form a pourable mass,
(b) molding a workpiece from said mass,
(c) hardening the molded workpiece, and
(d) nitriding the hardened workpiece in a nitrogen atmosphere to form silicon nitride and silicon oxynitride to a degree that SiO$_2$ and elemental silicon remain detectable in the nitrided workpiece, is useful as the material of construction for crucibles and tools for confining, handling and treating melts of metals or salts.

16 Claims, No Drawings

MATERIALS RESISTANT TO METAL AND SALT MELTS, THEIR PRODUCTION AND THEIR USE

This invention relates to materials which are resistant to metal and salt melts, to the production of these materials and to their use.

BACKGROUND OF THE INVENTION

The costs involved in the manufacture of inexpensive solar cells based on crystalline silicon needs to be considerably reduced in relation to the current price level. This presupposes the development of a new technology from the production of a chemically adequate pure silicon from the crystallization process to the molding of the cells.

Moldings of high-purity quartz are commercially obtainable. Since quartz is among the materials which have very little contamination effect on chemically highly pure metal melts, it is advantageously used as crucible material in Czochralski drawing plants in the manufacture of high-purity silicon. By contrast, the use of quartz chill molds for the crystallization of silicon melts involves problems. The coefficient of linear thermal expansion of quartz (approx. $5.5 \times 10^{-7}$) is lower than that of silicon ($3 \times 10^{-6} \times C^{-1}$) by a factor of 10. Since silicon unites firmly with the walls of the quartz chill mold during solidification, tensions are built up during the solidification and cooling of the silicon block, resulting in cracks in the silicon block and in breakage of the quartz chill mold. In addition, quartz vessels tend to devitrify and shatter on cooling from the necessary temperature range. Accordingly, they cannot be reused and, by virtue of their high cost, contribute considerably towards increasing the overall cost of the silicon crystallization process.

In order to avoid direct contact between the silicon melt and the quartz wall and, hence, fusion of the silicon block and quartz crucible, quartz crucibles coated with silicon nitride have been proposed [T. Saito, A. Shimura, S. Ishikawa, Solar Energy Materials 9, 337–345 (1983)].

Owing to devitrification, however, materials thus coated are also reusable to only a limited extent. The use of quartz moldings is also limited by increasing softening of the material with increasing temperature of the silicon melt, so that there is a practical limit at around 1500° C. for the use of quartz for handling silicon melts.

Higher temperatures can be reached with graphite. Since, in addition, graphite is very easy to machine, its use for handling metal melts appears to be very attractive. Graphite qualities of high density, clearly pronounced crystallinity and relatively little open porosity are commercially obtainable and show adequate chemical resistance to silicon melts.

On contact with liquid silicon, graphite forms a thin SiC layer. Through the diffusion of carbon into the melt, secretions of SiC are formed when the solubility limit is exceeded. It is a well known phenomenon that SiC secretions significantly reduce the efficiency of solar cells.

Compact-sintered silicon nitride moldings can be produced by hot pressing of $Si_3N_4$ using sinter additives. However, the processes involved are complicated and expensive so that moldings produced in this way cannot contribute towards reducing costs in the handling of silicon melts.

A general disadvantage of $Si_3N_4$ ceramics is that the moldings can only be aftertreated with diamond-tipped tools which is both difficult and expensive.

In order therefore effectively to reduce the costs involved in a process for handling silicon, particularly in fusion and crystallization processes, the problem arose of replacing the expensive materials hitherto used, namely quartz, carbon and $Si_3N_4$ ceramics with their above-described disadvantages, by a new, inexpensive and easy-to-produce material which does not have these disadvantages.

These requirements are excellently satisfied by the material according to the invention described hereinafter.

BRIEF DESCRIPTION OF THE INVENTION

The material of this invention comprises of a $\alpha$- and $\beta$-silicon nitride, silicon oxynitride, silicon dioxide and elemental silicon and, accordingly, is characterized by several phases present alongside one another.

Accordingly, the present invention relates to materials which are resistant to metal and salt melts and which are characterized in that they are a composite material consisting of silicon nitride, silicon oxynitride, silicon dioxide and silicon.

DETAILED DESCRIPTION

The individual components may be present in the materials according to the invention in quantities of up to 95% by weight.

Depending on the salt and metal melt in contact with the material, it may be of advantage to influence the wettability of the molding and its susceptibility to corrosion through the quantities of silicon nitride, silicon oxynitride, silicon dioxide and silicon carbide. Thus, it is known that silicon dioxide is heavily attacked by melts containing fluorides or hydrogen flurloride while silicon carbide and silicon nitride are more resistant. It is also known that silicon dioxide reacts with liquid silicon to form volatile silicon monoxide. On the other hand, silicon dioxide is poorly wetted by a silicon melt whereas silicon nitride and silicon carbide are wetted relatively well. Since silicon dioxide gradually softens at temperatures above 1300° C., relatively high levels of silicon nitride and silicon oxynitride which can be formed by reaction sintering provide the molding with greater stability to deformation at temperatures in that range.

In one particularly preferred embodiment, the materials according to the invention contain from 40 to 90% by weight of silicon nitride, from 2 to 20% by weight of silicon dioxide, from 2 to 20% by weight of silicon oxynitride and from 2 to 20% by weight of elemental silicon.

The materials according to the invention may also contain silicon carbide as another phase, depending on the field of application. Accordingly, another more advantageous embodiment of the materials according to the invention is characterized in that they additionally contain silicon carbide in quantities of up to 60% by weight and preferably in quantities of from 15 to 30% by weight.

The materials according to the invention may be clearly identified by X-ray powder diffractometry. In the case of a mixture of substances, the interference lines of the components appear alongside one another in the diffractogram. From the position of the interference lines, it is possible to determine diffraction angles and, in accordance with Bragg's equation,

| | n = 1, 2, 3, 4, ... |
|---|---|
| n · λ = 2 d sin α | λ = X-ray wavelength |
| | α = diffraction angle | the lattice plane intervals d. The materials produced in accordance with the invention are thus best characterized by their crystallographic d-values. The following reflexes must always be present:

| d-values | | | | |
|---|---|---|---|---|
| 6.603 | 2.803 | 2.150 | 1.543 | 1.314 |
| 4.677 | 2.655 | 2.074 | 1.507 | 1.296 |
| 4.427 | 2.587 | 1.917 | 1.482 | 1.285 |
| 4.308 | 2.533 | 1.894 | 1.450 | 1.264 |
| 3.874 | 2.484 | 1.822 | 1.433 | 1.252 |
| 3.798 | 2.419 | 1.800 | 1.415 | |
| 3.354 | 2.386 | 1.763 | 1.402 | |
| 3.287 | 2.307 | 1.748 | 1.346 | |
| 3.129 | 2.270 | 1.633 | 1.337 | |
| 2.876 | 2.175 | 1.588 | 1.328 | |

The d-values of the silicon carbide which may be present as an additional phase are not shown here.

The present invention also relates to a process for the production of the materials according to the invention. The materials according to the invention are generally produced by processing silicon powder with $SiO_2$ sols to form a pourable mass and hardening the mass thus formed in a mold after addition of substances which lead to gelation of the $SiO_2$ sols. Moldings of any shape can be produced in this way.

The process according to the invention is characterized in that silicon powder is suspended in $SiO_2$ sol to form a pourable mass, a workpiece is formed from this mass and hardened and, after the $SiO_2$-bound silicon has been removed from the mold, it is reacted under nitrogen to form silicon nitride and silicon oxynitride in such a way that $SiO_2$ and elemental silicon remain detectable in the nitrided workpiece.

The particular feature of the process according to the invention lies in the use of $SiO_2$ sols which can be gelled by addition of an electrolyte. in the most simple case, the silicon powder is dispersed in $SiO_2$ sol, an electrolyte is added and the suspension is poured into a given mold.

It is of particular advantage to harden the pourable mass in the presence of acids, bases, fluorides, alkaline earth oxides and/or ammonium salts.

After a few minutes, the suspension hardens and the cast molding may be removed from the mold without difficulty. The time required for hardening may be varied within wide limits through the type and quantity of electrolyte added, through the concentration of the $SiO_2$ sol and through the ratio of silicon powder to $SiO_2$ sol and electrolyte.

The subsequent drying process has to be carried out relatively slowly to avoid shrinkage cracks. The molding thus obtained is heated and nitrided in a nitrogen-containing atmosphere to form the material characterized at the beginning.

The molded workpieces are best dried under reduced pressure at temperatures of from 50° to 350° C.

The $SiO_2$ present is partly converted into silicon oxynitrides; in high concentration, it can accumulate at the surface of the molding during the nitriding process so that a glaze is formed.

The presence of free silicon in the moldings according to the invention is not critical to their application, for example in the crystallization of liquid silicon.

In one particular variant of the process for producing the moldings, materials inert to a reaction with nitrogen may be added to the pourable suspension. It is of particular advantage in this respect to use pure silicon compounds, such as α- and β-silicon nitride, silicon carbide, silicon oxynitride and/or silicon dioxide. Considerable economy is achieved by adding used nitride moldings after size-reduction and, optionally, purification to the pourable suspension of silicon powder and $SiO_2$ sol, thus reducing the demand for raw materials. This recycling is of particular significance where particularly pure raw materials are used to preclude contamination of the liquid silicon. The reuse of the raw materials contributes significantly towards reducing the crystallization costs.

Up to 80% by weight of the powder used in the pourable suspension may be replaced by recycled material. The intensity ratios of the X-ray diffractometer reflexes mentioned earlier on may be varied according to the quantity of recycled material added. When pure silicon nitride, silicon carbide, silicon oxynitride or silicon dioxide phases are added, the X-ray diffractometer reflexes of those phases are of course also present in the end product. In this case, too, up to 80% by weight of the total quantity of powder used may consist of silicon nitride, silicon carbide, silicon oxynitride or silicon dioxide phases or of mixtures of these phases.

In one particularly preferred embodiment of the process according to the invention, therefore, silicon nitride, silicon oxynitride and/or silicon carbide in powder form are added to the silicon powder in quantities of up to 80% by weight, based on the total quantity of powder.

This process for producing the new materials is unaffected by the quality of the silicon used. Where metallurgical-grade silicons are used, however, the impurity content of the silicon may be too high to rule out contamination of the solar silicon melt during crystallization. In this case, it is advisable to pre-purify the silicon.

For the production of high-quality materials, it is advisable to use purified silicon of which the total impurity content is $<1000$ ppm$_g$ and preferably $\leq 100$ ppm$_g$.

It is also of advantage to expose the silicon powder to an oxidizing treatment before it is added to the $SiO_2$ sol. This may be done by treating the silicon powder with air and/or steam at temperatures of from 40° to 350° C. and also by treatment with an aqueous $H_2O_2$ solution at temperatures of from 20° to 100° C.

Any commercial $SiO_2$ sol may be used as suspension medium and binder for the purposes of the invention, although silica sols having $SiO_2$ contents of from 15 to 40% and pH values of from 3.4 to 10 are preferred. Where alkalized silica sols are used, it is best to desensitize the silicon powder by treatment with air at elevated temperature or with aqueous $H_2O_2$.

To gel and harden the pourable mass, use is made of the sensitivity of the silica sols to additions of electrolytes, such as for example acids, bases, ammonium salts, fluorides or alkaline earth oxides. Ammonium salts have proved to be particularly effective for this purpose because they can be thoroughly heated without leaving any residue before or during the nitriding process and, accordingly, do not form an additional source of contamination where the moldings are subsequently used for the handling of chemically highly pure silicon melts.

The ratio of solid to $SiO_2$ sol is as important to the density of the corresponding moldings as the particle size distribution of the silicon powders used or the type and quantity of foreign-phase materials added, such as silicon carbide, silicon nitride or silicon oxynitride. The viscosity of the suspension to be poured should be adjusted to such a level that there is no separation of fine and coarse particles.

After gelling and hardening of the pourable mass in the mold, the workpiece may be removed from the mold and dried. Drying has to be carried out particularly carefully to avoid the formation of cracks in the moldings. In general, it is favorable to dry the moldings in air for one week at room temperature after removal from the mold. The drying rate depends upon such molding parameters as, for example, size and wall thickness, so that the time indicated can only be an approximate value.

In order to dry relatively complicated moldings particularly carefully, it can also be useful in accordance with the invention to carry out the drying process in chambers of defined air humidity. After this first drying step, a second drying step may be carried out at higher temperatures and, optionally, under reduced pressure. The moldings thus obtained are stable in their green state and may be machined.

The green moldings are nitrided at temperatures of from 1300° C. to 1480° C. in an atmosphere which may be pure nitrogen, nitrogen/noble gas, nitrogen/hydrogen, nitrogen/steam, nitrogen/hydrogen/steam, nitrogen/ammonia or nitrogen/hydrogen/ammonia gas mixtures. During the nitriding process, it is favorable to increase the temperature in stages or continuously from 1300° C. to 1400° C. According to the invention, the nitriding process may be terminated by increasing the temperature beyond the melting point of the silicon to 1480° C. The nitriding time is governed by such molding parameters as, for example, size and wall thickness. In general, however, the nitriding process is over after a reaction time of 40 to 100 hours. If necessary, the nitrided moldings thus obtained are easy to machine and are suitable for the handling of silicon melts which, for example, satisfy the purity criteria required for the production of solar cells.

If the material is to be used at temperatures below 1400° C., it can be useful for economic reasons to produce moldings having a high content of free elemental silicon by applying short nitriding times. One particular advantage of the moldings produced by the claimed process is that they remain dimensionally stable during the nitriding process, i.e. do not undergo any significant shrinkage or expansion.

By virtue of their excellent properties, the materials according to the invention are particularly suitable for the production of crucibles for the handling of the metal and salt melts of which the melting point does not exceed 1800° C.

Accordingly, the present invention also relates to the use of the materials according to the invention for the production of crucibles for the melting and crystallization of metals, particularly silicon, and as tools in the handling and treatment of metal melts, particularly silicon melts, and to their use for the production and crystallization of salt melts and as tools in the handling and treatment of salt melts.

The following Example is intended to illustrate the invention without limiting it in any way.

EXAMPLE

Silicon powder of commercial metallurgical quality is purified by treatment with an acid mixture consisting of 3 to 30% HCl and 0.5 to 8% HF. The powder is then washed with distilled water until free from acid and dried in air at 250° C. 2730 g of this silicon powder are suspended in 1943 g of a silica sol containing 30% $SiO_2$. After addition of 75 g of silicon nitride, silicon oxynitride and/or silicon carbide, 114 ml of an aqueous solution of ammonium sulfate (500 g/l) are added as gelling agent. The addition of the gelling agent is gauged in such a way that hardening begins after about 4 minutes.

The mass thus obtained is poured into plastic or metal molds designed for the production of moldings measuring $10 \times 10 \times 20$ cm$^3$ (length $\times$ width $\times$ height; internal dimensions) for a wall thickness of 0.5 cm. After 2 hours, the hardening of the pourable mass has progressed to such an extent that the moldings, which are referred to hereinafter as "green" in accordance with ceramic usage, may be removed from the molds. The green moldings are then dried in air for 7 days at room temperature and subsequently heated to 250° C. in a vacuum drying cabinet.

The green moldings are nitrided in a nitrogen atmosphere at a temperature which is continuously increased over a period of 66 hours from 1300° C. to 1400° C. To terminate the nitriding process, the temperature is then increased to 1480° C. and kept there for 6 hours.

A nitrided workpiece obtained in this way may readily be machined with the usual tools and may be used as a crucible for the production of a silicon melt.

Workpieces of any shape suitable for the handling of silicon melts may be produced in this way. In particular, it is possible by this process to produce, for example, tubes and crucibles and also chill molds which may be reused after crystallization of the silicon melt.

What is claimed is:

1. A material resistant to high temperature melts of metal and salt which comprises a composite material containing silicon nitride, silicon oxynitride, silicon dioxide and silicon.

2. A material as claimed in claim 1 wherein each of the individual components of the composite are present in quantities of up to 95% by weight.

3. A material as claimed in claim 1 containing from 40 to 90% by weight of silicon nitride, from 2 to 20% by weight of silicon dioxide, from 2 to 20% by weight of silicon oxynitride and from 2 to 20% by weight of elemental silicon.

4. A material as claimed in claim 1 additionally containing silicon carbide in quantities of up to 60% by weight.

5. A material as claimed in claim 4 wherein the quantity of silicon carbide is from 15 to 30% by weight.

6. A material as claimed in claim 4 wherein the composite material and the silicon carbide are in separate phases.

7. A material as claimed in claim 1 wherein the components of the composite material are in a plurality of phases which are side-by-side.

8. A process for producing the material claimed in claim 1 which comprises:
(a) suspending silicon powder in $SiO_2$ sol to form a pourable mass,
(b) molding a workpiece from said mass, (c) hardening the molded workpiece, and (d) nitriding the hardened workpiece in a nitrogen atmosphere to form silicon nitride and silicon oxynitride to a degree that $SiO_2$ and elemental silicon remain detectable in the nitrided workpiece.

9. A process as claimed in claim 8 wherein the silicon powder is subjected to an oxidizing treatment before suspension in the $SiO_2$ sol.

10. A process as claimed in claim 8 wherein for step (a) silicon powder and a powder of at least one of silicon nitride, silicon oxynitride or silicon carbide in quantities of up to 80% by weight, based on the total quantity of powder are suspended in the $SiO_2$ sol.

11. A process as claimed in claim 10 wherein the silicon powder is subjected to an oxidizing treatment before suspension in the $SiO_2$ sol.

12. A process as claimed in claim 8 wherein the pourable mass is hardened in the presence of at least one of acid base, fluoride, alkaline earth oxide or ammonium salt.

13. A process as claimed in claim 8 wherein the nitriding step (d) is carried out at 1300° to 1480° C. in a nitrogen atmosphere.

14. A process as claimed in claim 13 wherein the nitrogen atmosphere also contains at least one of ammonia, hydrogen or steam.

15. A molded crucible capable of confining molten metal or a salt melt comprising and fabricated from a material according to claim 1.

16. A tool useful for handling and treating molten metals or salt melts fabricated from a material according to claim 1.

* * * * *